United States Patent
Döllgast et al.

(10) Patent No.: US 7,504,762 B2
(45) Date of Patent: Mar. 17, 2009

(54) RECEIVING SLEEVE FOR A PIEZOELECTRIC ACTUATOR

(75) Inventors: Bernd Döllgast, Erlangen (DE); Horst Gilg, Maxhütte (DE); Jörg Haubold, Limbach-Oberfrohna (DE); Emanuel Sanftleben, Geisling (DE); Carsten Schuh, Baldham (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 320 days.

(21) Appl. No.: 10/541,012

(22) PCT Filed: Oct. 12, 2004

(86) PCT No.: PCT/EP2004/052505

§ 371 (c)(1), (2), (4) Date: Aug. 16, 2005

(87) PCT Pub. No.: WO2005/036663

PCT Pub. Date: Apr. 21, 2005

(65) Prior Publication Data

US 2006/0163972 A1 Jul. 27, 2006

(30) Foreign Application Priority Data

Oct. 14, 2003 (DE) .................... 103 47 770

(51) Int. Cl.
*H01L 41/08* (2006.01)
(52) U.S. Cl. .................................... 310/328
(58) Field of Classification Search ............ 310/323.01, 310/328, 338, 348
See application file for complete search history.

(56) References Cited

U.S. PATENT DOCUMENTS

| | | | | |
|---|---|---|---|---|
| 4,429,247 | A | * | 1/1984 | Feldman ................... 310/322 |
| 4,814,659 | A | | 3/1989 | Sawada |
| 4,884,002 | A | | 11/1989 | Eusemann et al. |
| 5,004,945 | A | | 4/1991 | Tomita et al. |
| 5,737,963 | A | * | 4/1998 | Eckert et al. ............. 73/290 V |
| 5,740,969 | A | | 4/1998 | Hoffmann et al. |
| 6,681,462 | B1 | * | 1/2004 | Frank et al. ............... 29/25.35 |
| 6,781,289 | B2 | | 8/2004 | Heinz et al. |
| 7,024,737 | B2 | | 4/2006 | Schuh et al. |

FOREIGN PATENT DOCUMENTS

| | | |
|---|---|---|
| DE | 37 35 623 C2 | 5/1989 |
| DE | 195 38 791 A1 | 4/1997 |
| DE | 199 39 132 A1 | 8/1999 |
| DE | 198 18 036 A1 | 11/1999 |
| DE | 198 44 742 C1 | 3/2000 |
| DE | 100 25 997 A1 | 12/2001 |
| DE | 100 26 635 A1 | 1/2002 |
| WO | 99/08330 | 2/1999 |
| WO | 2004/004021 A2 | 1/2004 |

* cited by examiner

*Primary Examiner*—Mark Budd
(74) *Attorney, Agent, or Firm*—Laurence A. Greenberg; Werner H. Stemer; Ralph E. Locher

(57) ABSTRACT

The invention relates to a receiving sleeve for a piezoelectric actuator, in particular for a piezoelectric actuator for driving an injector of an injection system in an internal combustion engine. Said sleeve comprises a first sleeve part (1) and a second sleeve part (2), the first sleeve part (1) being connected to the second sleeve part (2) when the sleeve is assembled. In addition, the inventive receiving sleeve comprises an anti-rotation element (6, 8) for maintaining a predefined angular position between the first sleeve part (1) and the second sleeve part (2).

20 Claims, 1 Drawing Sheet

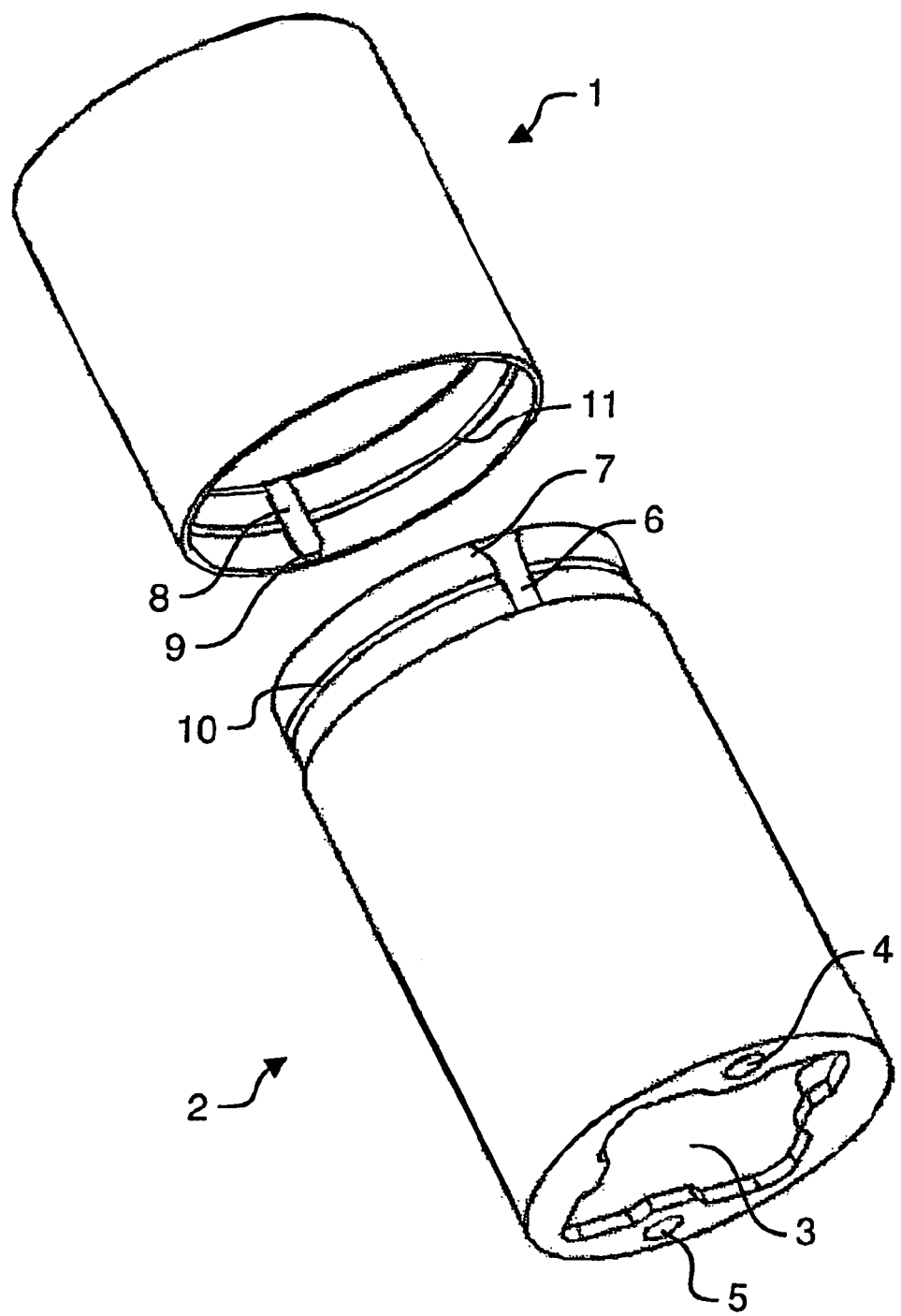

RECEIVING SLEEVE FOR A PIEZOELECTRIC ACTUATOR

BACKGROUND OF THE INVENTION

Field of the Invention

The invention relates to a receiving sleeve for a piezoelectric actuator, in particular for a piezoelectric actuator for driving an injector of an injection system for an internal combustion engine, having a first sleeve part and a second sleeve part. The first sleeve part is connected to the second sleeve part in the assembled state.

In modern injection systems for internal combustion engines, piezoelectric actuators are increasingly used for driving the injectors. During the assembly of piezoelectric actuators of said type, a piezoceramic stack is traditionally installed in a cylindrical receiving sleeve which consists of two cylindrical sleeve parts. Disposed in the end faces of the two cylindrical sleeve parts in this arrangement are recesses through which the piezoceramic stack projects externally, the receiving sleeve being somewhat shorter than the piezoceramic stack, so the frictional (non-positive) fit is achieved only via the end faces of the piezoceramic stack.

During the assembly of said known receiving sleeve it must be ensured that the piezoceramic stack fits precisely into the associated recesses in the two cylindrical sleeve parts. Toward that end, the piezoceramic stack is initially inserted into one of the two sleeve parts in such a way that the recess in the sleeve part receives the piezoceramic stack. Next, the second sleeve part is then placed on top and pressed onto the other sleeve part until the two sleeve parts are connected to each other by means of a snap-in connection. During this assembly process it must be ensured that the two sleeve parts maintain a predetermined angular position relative to each other so that the recesses in the end faces of the two sleeve parts lie one above the other in congruence, with the result that said end faces receive the piezoceramic stack. If, on the other hand, there is an angular displacement between the two sleeve parts during assembly, the recesses for the piezoceramic stack do not lie one above the other in congruence, with the result that the receiving sleeve cannot be assembled.

Consequently, a disadvantage with the known receiving sleeve is the laborious and complicated assembly process.

SUMMARY OF THE INVENTION

The object of the invention is therefore to create a receiving sleeve for a piezoelectric actuator which enables assembly with a limited degree of effort and complexity.

This object is achieved, taking as a starting point the known receiving sleeve according to the preamble of claim 1 as described at the beginning, by the characterizing features of claim 1.

The invention includes the general technical teaching of providing an anti-rotation element so that the two sleeve parts of the receiving sleeve maintain a predetermined angular position relative to each other, thereby facilitating assembly.

An anti-rotation element of said type offers the advantage that during the assembly of the receiving sleeve according to the invention it is not necessary to take account of the exact angular orientation of the two sleeve parts, since this is ensured by the anti-rotation element.

In a preferred exemplary embodiment of the invention, the anti-rotation element has a slot-and-key connection which consists of a slot incorporated on one of the two sleeve parts and a key of matching shape, affixed to the other sleeve part, which engages in the slot in the assembled state. The anti-rotation element can also have a plurality of slots and keys which are disposed in a distributed arrangement over the circumference of the sleeve parts and engage with one another in pairs in each case in order to maintain a predetermined angular position between the two sleeve parts.

The slot and/or key of an anti-rotation element of said type preferably have/has an insertion bevel which facilitates the assembly of the receiving sleeve according to the invention by allowing a pre-assembly of the two sleeve parts even with an angular displacement, which is then corrected during assembly by means of the insertion bevel. In this case the maximum permissible angular displacement between the two sleeve parts can lie in the range between 1° and 10°, which considerably simplifies the assembly of the receiving sleeve according to the invention, since the requirements in respect of the angular orientation of the two sleeve parts are reduced.

In the assembled state of the receiving sleeve according to the invention the individual sleeve parts are preferably joined to each other by means of a plug-and-socket connection, the plug-and-socket connection having a predetermined length contingent on its design. In this context the length of the plug-and-socket connection is understood to mean the path by which the two sleeve parts must be moved relative to each other in order to transition from a completely separated state into the assembled state. With a plug-and-socket connection of said type it is advantageous if the insertion bevel of the slot or key extends over only a part of the plug-and-socket connection length in the axial direction of the sleeve parts, while the remaining part of the plug-and-socket connection length can be taken up by the anti-rotation element. If, in fact, the insertion bevel were to extend over the entire length of the plug-and-socket connection, the anti-rotation element would only become effective when the two sleeve parts are completely mated together. If, on the other hand, the insertion bevel were to extend over only a fraction of the plug-and-socket connection length, the angular displacement initially arising between the two sleeve parts during the pre-assembly would have to be cancelled out over a very short push-on length, which is mechanically disadvantageous. With the receiving sleeve according to the invention the insertion bevel therefore extends over 10% to 50% of the entire length of the plug-and-socket connection, which represents a good compromise between a reliable action of the anti-rotation element on the one hand and a good compensation of the angular displacement between the sleeve parts to be assembled on the other.

It should also be mentioned that the slot and/or key of the anti-rotation element preferably extend/extends at least over a part of the length of the plug-and-socket connection, starting from the free end of the respective sleeve part in each case, so that the key engages in the associated slot already during the joining together of the two sleeve parts and not just when they are in the fully assembled state.

It is furthermore advantageous if the slot and/or key of the slot-and-key connection extends over the entire length of the plug-and-socket connection, with the insertion bevel taking up only a part of the length of the plug-and-socket connection, while the anti-rotation element takes up all of the remainder of the plug-and-socket connection length. In this arrangement the slot-and-key connection therefore acts on a part of the length of the plug-and-socket connection as an anti-rotation element and on the other part of the length of the plug-and-socket connection as an assembly aid for compensating for an angular displacement between the sleeve parts to be assembled.

It is particularly advantageous if both the slot and the key in the slot-and-key connection have an insertion bevel so that the insertion bevels of slot and key slide onto each other in pairs, with the result that an angular displacement between the sleeve parts to be assembled is corrected with low mechanical stresses. In this arrangement the insertion bevel of the slot preferably has essentially the same insertion angle as the insertion bevel of the key, so that during assembly the two insertion bevels slide onto each other in essentially plane-parallel fashion and consequently with a low degree of wear.

The two sleeve parts are preferably joined together in the assembled state by means of a conventional snap-in connection, although in principle other positive and non-positive (frictional) connections are also possible between the sleeve parts to be assembled.

When a snap-in connection is used, it is advantageous if the insertion bevel acts only up to the latching point when the two sleeve parts are mated together, whereas after going beyond the latching point of the snap-in connection only an anti-rotation element exists. In this case, therefore, a possible angular displacement between the sleeve parts to be assembled is compensated for before the latching point of the snap-in connection is exceeded.

With regard to the design of the insertion bevel there are manifold possibilities, although in the preferred exemplary embodiment the insertion bevel is essentially straight and uncurved. However, it is also possible within the scope of the invention that the insertion bevel has, for example, a curvilinear or curved shape.

It should also be mentioned that the insertion bevel in the preferred exemplary embodiment transitions seamlessly into the anti-rotation element. The insertion bevel can, for example, transition with a bend into the anti-rotation element, but it is also possible that the insertion bevel transitions without a bend into the anti-rotation element.

It has already been mentioned at the beginning in the description of the prior art that the two sleeve parts each have recesses in their end faces for guiding the piezoelectric actuator, which is preferably also the case with the receiving sleeve according to the invention.

In the assembled state the piezoelectric actuator projects externally through said recesses out of the receiving sleeve according to the invention, the piezoelectric actuator with the recesses preferably forming a fit whose angular clearance is greater than the angular clearance of the anti-rotation element in order to prevent the receiving sleeve according to the invention exerting torsional forces on the piezoelectric actuator.

Other advantageous developments of the invention are characterized in the dependent claims or will be explained in more detail below together with the description of the preferred exemplary embodiment of the invention with reference to the FIGURE. Thus, the single FIG. 1 shows a perspective view of a receiving sleeve according to the invention for a piezoelectric actuator for driving an injector of an injection system for an internal combustion engine (for reasons of simplicity the piezoelectric actuator itself is not shown).

The receiving sleeve essentially consists of two cylindrical sleeve parts 1, 2, in each of the end faces of which there is disposed a recess 3 for guiding the piezoelectric actuator, the recess disposed in the sleeve part 1 being concealed in the drawing.

Also disposed in each of the end faces of the two sleeve parts 1, 2 are two circular holes 4, 5 which are arranged on opposite sides in the respective end faces and allow connecting pins of the piezoelectric actuator to be passed through. The holes disposed in the sleeve part 1 are likewise concealed in the FIGURE.

During the assembly of the receiving sleeve the piezo stack is initially inserted into the sleeve part 2 until the piezo stack projects through the recess 3 to the outside, with the recess 3 mechanically guiding the piezo stack. The connecting pins of the piezo stack then project through the holes 4, 5 in the sleeve part 2 to the outside, thereby enabling electrical contacting of the piezo stack.

Next, the sleeve part 1 is then mounted onto the sleeve part 2 in such a way that the recess 3 in the sleeve part 2 lies approximately in congruence under the corresponding recess in the end face of the sleeve part 1.

To simplify said assembly, two axially running slots 6 are disposed on opposite sides in the outer cylindrical surface of the sleeve part 2, the width of said slots increasing toward the free end of the sleeve part 2 in the direction of the other sleeve part 1 in the form of an insertion bevel 7.

Disposed on opposite sides in the inner cylindrical surface of the other sleeve part 1 are two keys 8 correspondingly matched in shape, the width of said keys decreasing toward the free end of the sleeve part 1 in the direction of the other sleeve part 2 in the form of an insertion bevel 9.

Thus, when the sleeve part 1 is mounted onto the sleeve part 2 there is advantageously no need for a precise angular orientation of the two sleeve parts 1, 2 relative to each other, since an angular displacement is corrected by means of the insertion bevels 7, 9.

In this arrangement the insertion bevels 7 of the slots 6 have the same insertion angle as the insertion bevels 9 of the keys 8, with the result that during assembly the insertion bevels 7, 9 slide onto each other in plane-parallel fashion and consequently with a low degree of wear.

In the assembled state the two sleeve parts 1, 2 are then mated with each other by means of a snap-in connection which consists of a circumferential slot 10 in the sleeve part 2 and a corresponding circumferential latching projection 11 in the inner cylindrical surface of the sleeve part 1.

It should also be mentioned that the insertion bevels 7, 9 extend only over a part of approximately 30% of the length of the plug-and-socket connection, while the slot-and-key connection between the slot 6 and the key 8 on the remaining part of the plug-and-socket connection length serves exclusively to prevent rotation. In this way the anti-rotation element is already effective when the latching point of the snap-in connection has been exceeded during assembly.

It should also be mentioned that the recesses 3 in the end faces of the sleeve parts 1, 2 form a fit with the piezo stack, the angular clearance of said fit being greater than the angular clearance of the anti-rotation element formed by the slot-and-key connection. By this means it is ensured that in the assembled state the sleeve parts 1, 2 bring no torsional force to bear on the piezo stack.

The invention is not limited to the preferred exemplary embodiment described in the foregoing. Rather, a multiplicity of variants and adaptations are possible which also make use of the inventive idea and therefore fall within the scope of protection.

We claim:

1. A piezoelectric actuator assembly, comprising:
   a piezoelectric actuator for driving an injector of an injection system for an internal combustion engine; and
   a receiving sleeve including a first sleeve part, a second sleeve part connected to said first sleeve part in an assembled state, and an anti-rotation element for maintaining a predetermined angular position between said first sleeve part and said second sleeve part as said first sleeve part and said second sleeve part are guided together;

said piezoelectric actuator at least partially inserted into said receiving sleeve; and said anti-rotation element having a slot-and-key connection with a slot formed in one of said first and second sleeve parts and a shape-matched key disposed on another of said first and second sleeve parts and engaging in the slot in the assembled state.

2. The receiving sleeve according to claim 1, wherein at least one of said slot and said key is formed with an insertion bevel, said insertion bevel enabling a pre-assembly of said first sleeve part and said second sleeve part with an angular displacement.

3. The receiving sleeve according to claim 2, wherein the angular displacement has a maximum angular displacement for the pre-assembly in a range between 1° and 10°.

4. The receiving sleeve according to claim 2, which comprises a plug-and-socket connection between said first sleeve part and said second sleeve part having a predetermined length, said insertion bevel extending in an axial direction over only a part of a length of said plug-and-socket connection.

5. The receiving sleeve according to claim 4, wherein said insertion bevel extends in the axial direction over 10% to 50% of the length of the plug-and-socket connection.

6. The receiving sleeve according to claim 4, wherein at least one of said slot and said key extends over at least a part of the length of said plug-and-socket connection, starting from a free end of a respective said sleeve part in each case, whereby said key engages in said slot early while said first and second sleeve parts are being joined to one another.

7. The receiving sleeve according to claim 4, wherein at least one of said slot and said key of said slot-and-key connection extends over the entire length of said plug-and-socket connection, said insertion bevel takes up a part of the length of said plug-and-socket connection, and said anti-rotation element takes up all of a remainder of the length of said plug-and-socket connection.

8. The receiving sleeve according to claim 1, wherein said slot and said key are each formed with an insertion bevel.

9. The receiving sleeve according to claim 8, wherein said insertion bevel of said slot has an insertion angle substantially equal to an insertion angle of said insertion bevel of said key, whereby, during an assembly, said insertion bevels slide onto one another in substantially plane-parallel orientation.

10. The receiving sleeve according to claim 8, which comprises a snap-in connection with a predetermined latching point, wherein, in the assembled state, said first sleeve part is mated with said second sleeve part by way of said snap-in connection.

11. The receiving sleeve according to claim 10, wherein said insertion bevel acts at a maximum only as far as said latching point when said first and second sleeve parts are joined together.

12. The receiving sleeve according to claim 2, wherein said insertion bevel runs substantially straight and uncurved.

13. The receiving sleeve according to claim 2, wherein said insertion bevel transitions seamlessly into said anti-rotation element.

14. The receiving sleeve according to claim 2, wherein said insertion bevel transitions with a bend into said anti-rotation element.

15. A receiving sleeve for a piezoelectric actuator, the receiving sleeve comprising:

a first sleeve part and a second sleeve part, said first sleeve part being connected to said second sleeve part in an assembled state of the receiving sleeve; and an anti-rotation element for maintaining a predetermined angular position between said first sleeve part and said second sleeve part;

said anti-rotation element having a slot-and-key connection with a slot formed in one of said first and second sleeve parts and a shape-matched key disposed on another one of said first and second sleeve parts and engaging in said slot in the assembled state;

at least one of said slot and said key formed with an insertion bevel, said insertion bevel enabling a pre-assembly of said first sleeve part and said second sleeve part with an angular displacement.

16. The receiving sleeve according to claim 15, wherein the angular displacement has a maximum angular displacement for the pre-assembly in a range between 1° and 10°.

17. The receiving sleeve according to claim 15, which comprises a plug-and-socket connection between said first sleeve part and said second sleeve part having a predetermined length, said insertion bevel extending in an axial direction over only a part of a length of said plug-and-socket connection.

18. The receiving sleeve according to claim 17, wherein said insertion bevel extends in the axial direction over 10% to 50% of the length of the plug-and-socket connection.

19. The receiving sleeve according to claim 17, wherein at least one of said slot and said key extends over at least a part of the length of said plug-and-socket connection, starting from a free end of a respective said sleeve part in each case, whereby said key engages in said slot early while said first and second sleeve parts are being joined to one another.

20. The receiving sleeve according to claim 17, wherein at least one of said slot and said key of said slot-and-key connection extends over the entire length of said plug-and-socket connection, said insertion bevel takes up a part of the length of said plug-and-socket connection, and said anti-rotation element takes up all of a remainder of the length of said plug-and-socket connection.

* * * * *